(12) United States Patent
Liu

(10) Patent No.: US 9,983,353 B2
(45) Date of Patent: May 29, 2018

(54) METHOD FOR THE FORMATION OF NANO-SCALE ON-CHIP OPTICAL WAVEGUIDE STRUCTURES

(71) Applicant: STMicroelectronics, Inc., Coppell, TX (US)

(72) Inventor: Qing Liu, Irvine, CA (US)

(73) Assignee: STMicroelectronics, Inc., Coppell, TX (US)

( * ) Notice: Subject to any disclaimer, the term of this patent is extended or adjusted under 35 U.S.C. 154(b) by 195 days.

(21) Appl. No.: 14/933,095

(22) Filed: Nov. 5, 2015

(65) Prior Publication Data
US 2016/0070060 A1   Mar. 10, 2016

Related U.S. Application Data

(63) Continuation of application No. 13/901,298, filed on May 23, 2013, now Pat. No. 9,206,526.

(51) Int. Cl.
| | | |
|---|---|---|
| *G02B 6/10* | (2006.01) | |
| *G02B 6/136* | (2006.01) | |
| *G02B 6/122* | (2006.01) | |
| *C30B 29/06* | (2006.01) | |
| *C30B 23/04* | (2006.01) | |
| *C30B 25/04* | (2006.01) | |
| *G02B 6/13* | (2006.01) | |
| *G02B 6/12* | (2006.01) | |
| *G02B 6/032* | (2006.01) | |

(52) U.S. Cl.
CPC .............. *G02B 6/107* (2013.01); *C30B 23/04* (2013.01); *C30B 25/04* (2013.01); *C30B 29/06* (2013.01); *G02B 6/122* (2013.01); *G02B 6/131* (2013.01); *G02B 6/136* (2013.01); *G02B 6/032* (2013.01); *G02B 2006/12061* (2013.01); *G02B 2006/12173* (2013.01); *G02B 2006/12176* (2013.01)

(58) Field of Classification Search
CPC ........ G02B 6/107; G02B 6/136; G02B 6/122; G02B 6/131; G02B 6/032; G02B 2006/12176; G02B 2006/12713; C30B 29/06; C30B 25/04; C30B 23/04
See application file for complete search history.

(56) References Cited

U.S. PATENT DOCUMENTS

| | | | | |
|---|---|---|---|---|
| 5,278,103 | A * | 1/1994 | Mallon | ............. H01L 21/31051 257/E21.243 |
| 5,508,234 | A * | 4/1996 | Dusablon, Sr. | ..... B81C 1/00047 216/2 |
| 6,735,370 | B1 * | 5/2004 | Da Silva Marques | G02B 6/132 385/129 |
| 7,133,586 | B2 | 11/2006 | Yegnanarayanan et al. | |

(Continued)

*Primary Examiner* — Ryan Lepisto
(74) *Attorney, Agent, or Firm* — Crowe & Dunlevy

(57) ABSTRACT

A strip of sacrificial semiconductor material is formed on top of a non-sacrificial semiconductor material substrate layer. A conformal layer of the non-sacrificial semiconductor material is epitaxially grown to cover the substrate layer and the strip of sacrificial semiconductor material. An etch is performed to selectively remove the strip of sacrificial semiconductor material and leave a hollow channel surrounded by the conformal layer and the substrate layer. Using an anneal, the conformal layer and the substrate layer are reflowed to produce an optical waveguide structure including the hollow channel.

26 Claims, 4 Drawing Sheets

(56) References Cited

U.S. PATENT DOCUMENTS

| | | | |
|---|---|---|---|
| 7,149,396 B2* | 12/2006 | Schmidt | G01N 21/0303 356/432 |
| 7,391,949 B2* | 6/2008 | Schmidt | G01N 21/0303 385/125 |
| 7,471,866 B2* | 12/2008 | Dumais | B82Y 10/00 385/129 |
| 7,653,281 B2* | 1/2010 | Stepanov | G02B 6/122 385/129 |
| 9,059,252 B1* | 6/2015 | Liu | H01L 21/7682 |
| 2002/0057226 A1* | 5/2002 | Koh | H01Q 1/38 343/786 |
| 2003/0035613 A1 | 2/2003 | Huber et al. | |
| 2005/0089262 A1* | 4/2005 | Jenkins | G02B 6/122 385/14 |
| 2007/0165980 A1 | 7/2007 | Jenkins et al. | |
| 2008/0112454 A1 | 5/2008 | Ma | |
| 2009/0016666 A1 | 1/2009 | Kuo et al. | |
| 2010/0158437 A1* | 6/2010 | Decorby | B82Y 20/00 385/14 |
| 2012/0219250 A1 | 8/2012 | Ren et al. | |

* cited by examiner

METHOD FOR THE FORMATION OF NANO-SCALE ON-CHIP OPTICAL WAVEGUIDE STRUCTURES

CROSS-REFERENCE TO RELATED APPLICATION

This application is a continuation of U.S. patent application Ser. No. 13/901,298 filed May 23, 2013, the disclosure of which is incorporated by reference.

TECHNICAL FIELD

The present invention relates to integrated optical circuits and, in particular, to optical waveguide structures formed in and supported by semiconductor substrates.

BACKGROUND

There is considerable interest in photonic integrated circuit technologies for both active and passive devices.

It is well known to transport electronic data between a data source and a data destination over an optical data path. The use of fiber-optic communications lines presents one well-known example of an optical data path. Indeed, with the continued development of optical communications technologies, functions previously performed in the electrical domain are now migrating into the optical domain. Optical channels are now replacing electric wires for the communication of electronic data, and optical signal processing is now replacing transistor signal processing for the manipulation of electronic data.

This migration towards optical solutions has even progressed down to the level of the integrated circuit. In this regard, the prior art teaches a number of optical waveguide structures implemented in semiconductor substrates. Compact on-chip optical waveguide structures are recognized to have extensive uses in semiconductor photonics.

As semiconductor integrated circuit process technology shrinks towards nano-scale features it is important for the optical waveguide structures formed in or supported by the integrated circuit substrate to also achieve nano-scale dimensions. However, it is difficult to make well-defined on-chip optical waveguide structures, especially in the nano-scale. In particular, there is a need to form densely populated hollow optical waveguides.

SUMMARY

In an embodiment, an optical waveguide comprises: a supporting substrate including a layer of insulating material having a top surface; and a layer of semiconductor material having a bottom surface in contact with the top surface of the layer of insulating material, said layer of semiconductor material including at least one hollow optical channel contained within the layer of semiconductor material and extending with a length parallel to the top surface of the layer of insulating material.

In an embodiment, an optical waveguide comprises: a layer of semiconductor material having a bottom surface and a top surface; a hollow optical channel contained within the layer of semiconductor material and extending with a length parallel to the bottom surface; wherein said top surface comprises first top surface portions on either side of the hollow optical channel and a second curved top surface portion extending over the hollow optical channel; wherein a lowest portion of an inner surface of the hollow optical channel is positioned below the first top surface portions; and wherein a highest portion of an inner surface of the hollow optical channel is positioned above the first top surface portions.

In an embodiment, a method comprises: forming a strip of sacrificial semiconductor material on top of a substrate layer formed of non-sacrificial semiconductor material; epitaxially growing a conformal layer of the non-sacrificial semiconductor material covering the substrate layer and the strip of sacrificial semiconductor material; selectively removing the strip of sacrificial semiconductor material to leave a hollow channel surrounded by the conformal layer and the substrate layer; and performing a reflow on the conformal layer and the substrate layer to produce an optical waveguide structure including said hollow channel.

BRIEF DESCRIPTION OF THE DRAWINGS

For a better understanding of the embodiments, reference will now be made by way of example only to the accompanying figures in which.

DETAILED DESCRIPTION OF THE DRAWINGS

Reference is now made to FIGS. 1-10 which illustrate the process steps in the formation of a nano-scale on-chip optical waveguide structure. It will be understood that the drawings are not necessarily presented to scale.

Figure 1:
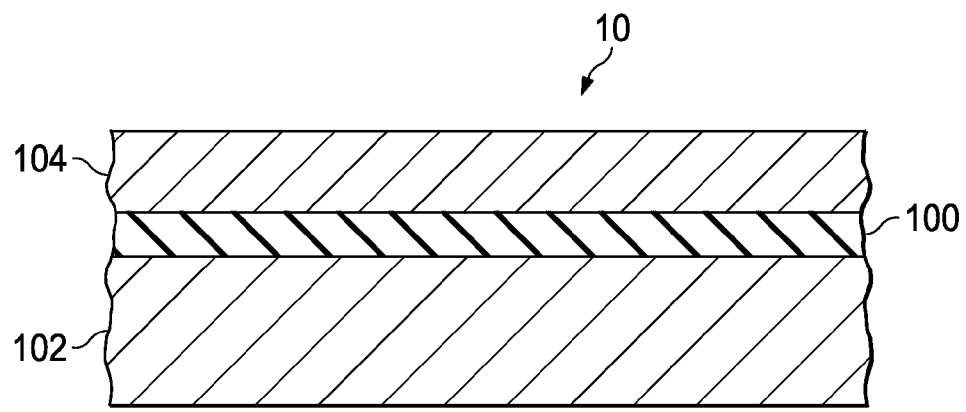
FIGS. 1-10 illustrates process steps in the formation of a nano-scale on-chip optical waveguide structure.

FIG. 1 shows a conventional silicon-on-insulator (SOI) substrate 10 formed by insulator layer 100 of silicon dioxide formed on a first silicon (Si) layer 102. A second silicon (Si) layer 104 is formed over the insulator layer 100. In a preferred implementation, the SOI substrate 10 is of the partially-depleted (PD) type (i.e., the substrate 10 comprises PD SOI as known in the art). The first and second silicon layers 102 and 104 may be doped as needed for the integrated circuit application. The thickness of the first and second silicon layers 102 and 104 may be tuned (for example, through the use of a thinning operation) as needed for the integrated circuit application. Although a PD SOI is preferred, it will be understood that other types of SOI substrates, including fully depleted (FD), could instead be used.

Figure 2:
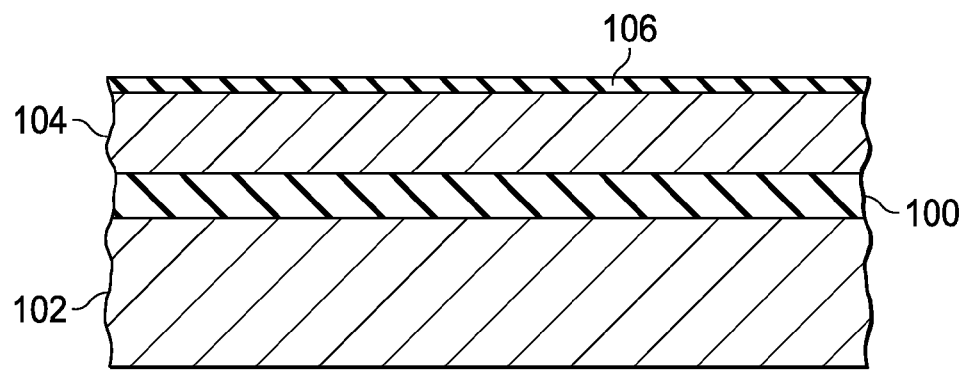

FIG. 2 shows the deposit of a silicon dioxide ($SiO_2$) layer 106 over the second silicon (Si) layer 104.

Figure 3:
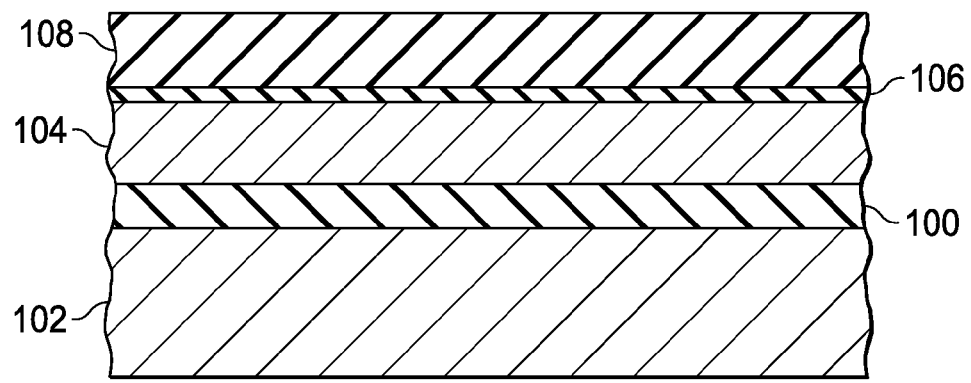

FIG. 3 shows the deposit of a silicon nitride (SiN) layer 108 over the silicon dioxide layer 106.

Figure 4:
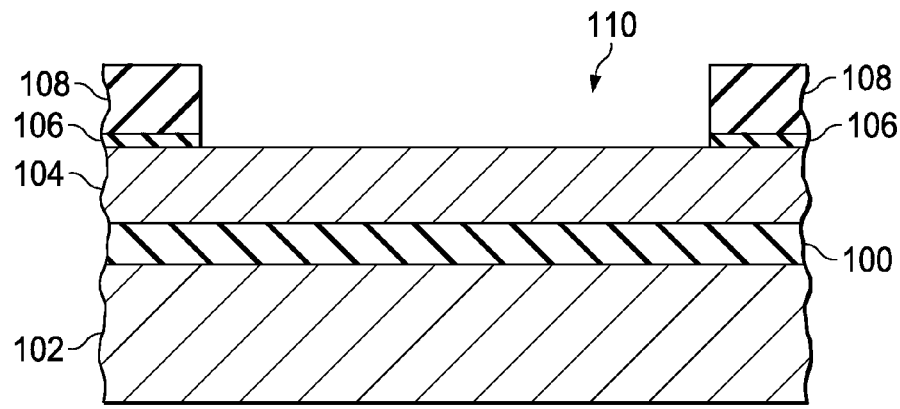

A lithographic process as known in the art is then used to form an opening 110 in the silicon nitride layer 108 and silicon dioxide layer 106 (a $SiN/SiO_2$ hard mask) which extends down to reach at least the top surface of the second silicon (Si) layer 104. The result of the lithographic process is shown in FIG. 4. The opening 110 may, in plan view, take on any desired shape governed by the dimensions of a waveguide area within which the nano-scale on-chip optical waveguide structures are to be produced. Exemplary shapes for the opening 110 include square and rectangular shapes.

Figure 5:
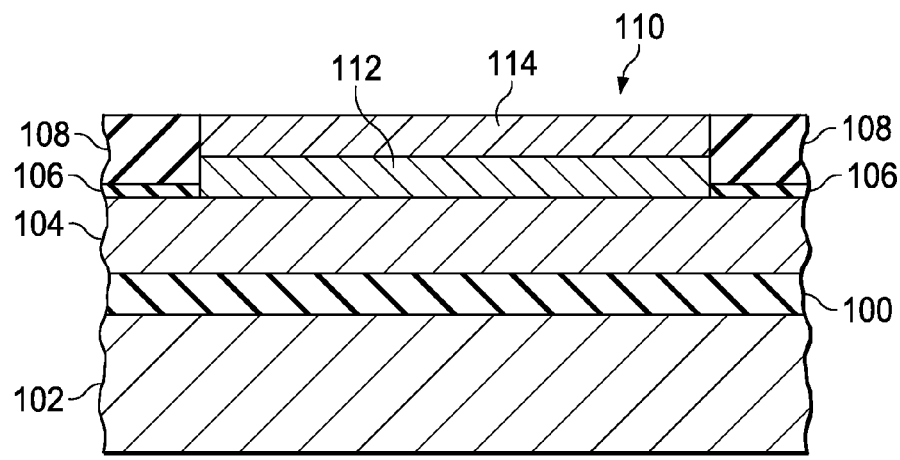

An epitaxial growth process as known in the art is then performed to grow a silicon-germanium (SiGe) layer 112 on top of the second silicon (Si) layer 104 within the opening 110. This silicon-germanium (SiGe) layer 112 is a sacrificial material layer as will be described in more detail below. The epitaxial growth process continues with the formation of a silicon layer (Si) 114 on top of the silicon-germanium (SiGe)

layer 112 within the opening 110. The result of the two step epitaxial growth process is shown in FIG. 5.

Figure 6:
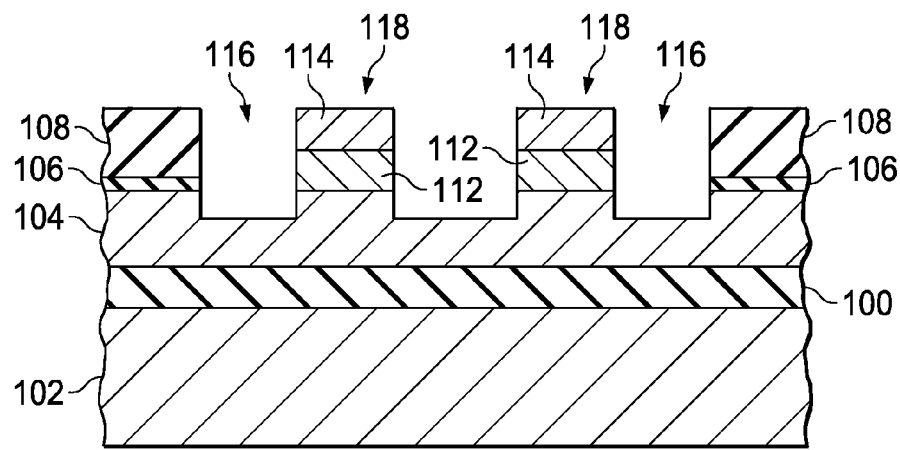

A lithographic process as known in the art is then used to form a plurality of trenches 116 which define at least one line 118 formed of a remaining portion of the second silicon (Si) layer 104, a remaining portion of the silicon-germanium (SiGe) layer 112 and a remaining portion of the silicon layer 114 as a material strip interposed between adjacent parallel trenches 116. The result of the lithographic process is shown in FIG. 6. Thus, a trench 116 is formed on either side of each line 118. If multiple lines 118 are formed, the trenches 116 may be shared between the lines 118. The trenches 116 extend completely through the silicon-germanium (SiGe) layer 112 and silicon layer (Si) 114 and in a preferred implementation further extend partially into the second silicon (Si) layer 104 of the SOI substrate 10. Each included line 118 extends as a bi-layer material strip along the opening 110, with multiple lines 118 in parallel with each other. Although two lines 118 are shown, it will be understood one fewer or more lines 118 could be provided within the opening 110 as dictated by the photonic needs of the integrated circuit application. Alternatively, the trenches 116 extend completely through the silicon-germanium (SiGe) layer 112 and silicon layer (Si) 114 to at least reach a top surface of the second silicon (Si) layer 104 of the SOI substrate 10 (it being important to remove the silicon-germanium (SiGe) layer 112 within each trench).

Figure 7:
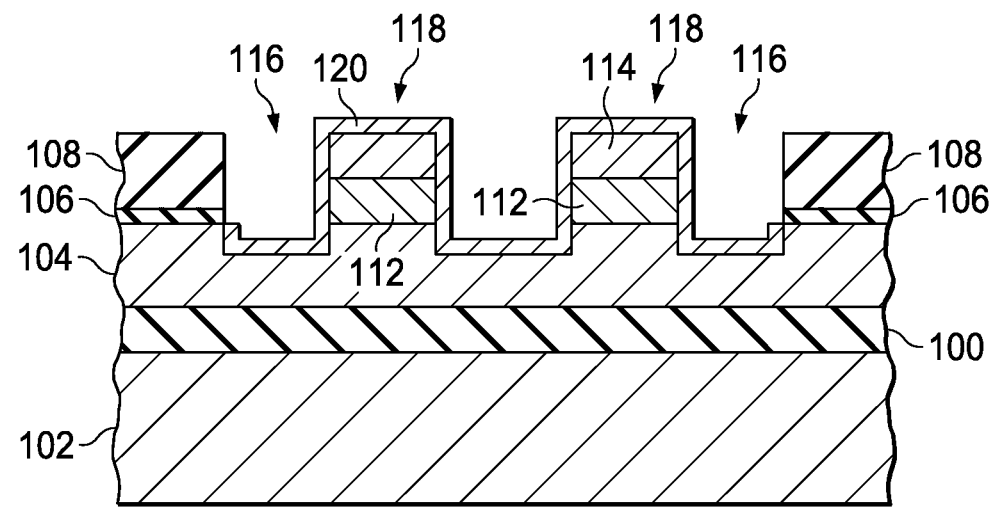

An epitaxial growth process as known in the art is then performed to grow a silicon layer (Si) 120 on top of the exposed surfaces of the second silicon (Si) layer 104, the silicon-germanium (SiGe) layer 112 and the silicon layer (Si) 114. The silicon layer (Si) 120 is a conformal layer covering the sides and top of the material strip. The result of the epitaxial growth process is shown in FIG. 7.

Figure 8:
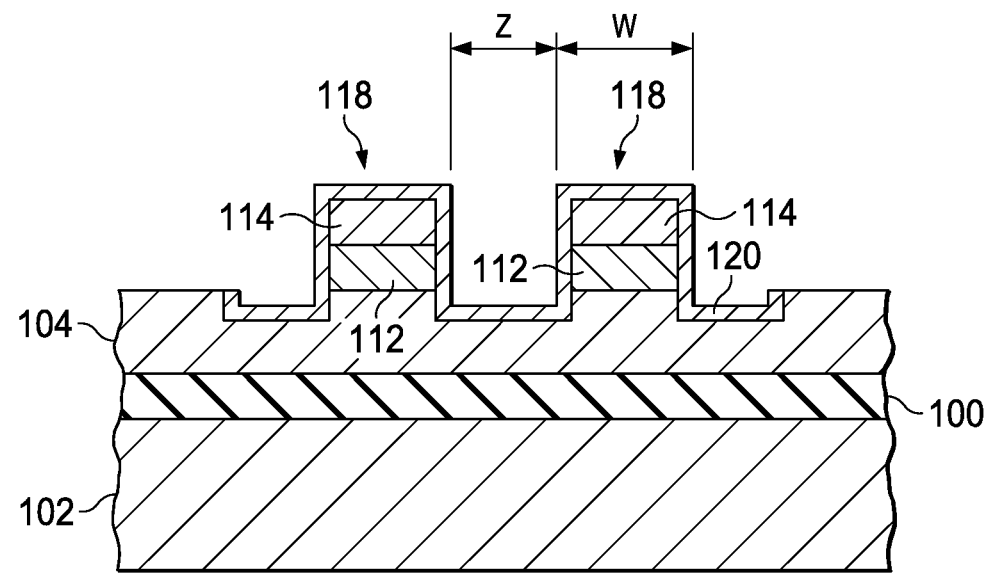

FIG. 8 shows that the SiN/SiO$_2$ hard mask has been removed. The effect of the removal of the SiN/SiO$_2$ hard mask is to expose the ends of the lines 118. In other words, this will give the process access to the silicon-germanium (SiGe) layer 112 within each of the lines 118.

In an exemplary implementation, the width w of the lines 118 may be of the range of 100 nm to hundreds of nm. The length of the lines 118 (extending perpendicular to the width w) may be of the range of several hundred nanometers to hundreds of microns. The etch selectivity between SiGe and Si can reach >300, under HCl, so the maximum length of the line 118 is decided by the thickness of the Si layer 120 which should typically be several tens of nanometers to several hundred nanometers. A spacing z between adjacent lines 118 may be of the range of several tens of nanometers to tens of microns or more as defined by the photomask.

Figure 9:
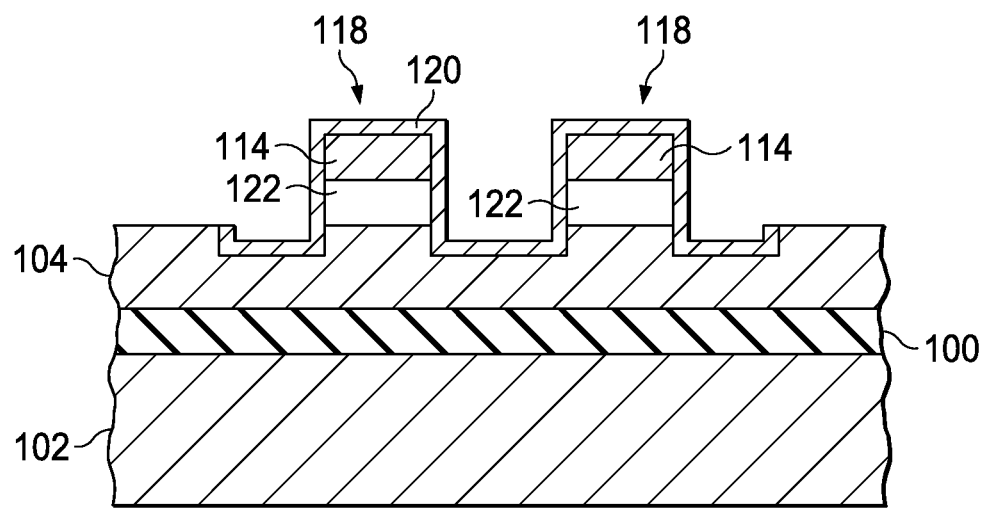

An etch process as known in the art is then performed to selectively remove the sacrificial material of the silicon-germanium (SiGe) layer 112 from within each of the lines 118. In an embodiment, the etch may comprise an HCl dry etch which is selective to remove SiGe and leave the Si structures in place. The result of the selective etch process is shown in FIG. 9. As a result of the removal of the silicon-germanium (SiGe) layer 112, each line 118 includes a hollow channel 122 which extends along the length of the line. The hollow channel 122 is surrounded on all sides by silicon structures in the form of silicon layer (Si) 120, second silicon (Si) layer 104 and silicon layer (Si) 114.

As an alternative, a wet clean such as hot SC1 (a mix of NH4OH and H2O2) can be used for the selective removal of SiGe, but this technique has significantly lower selectivity than HCl.

Figure 10:
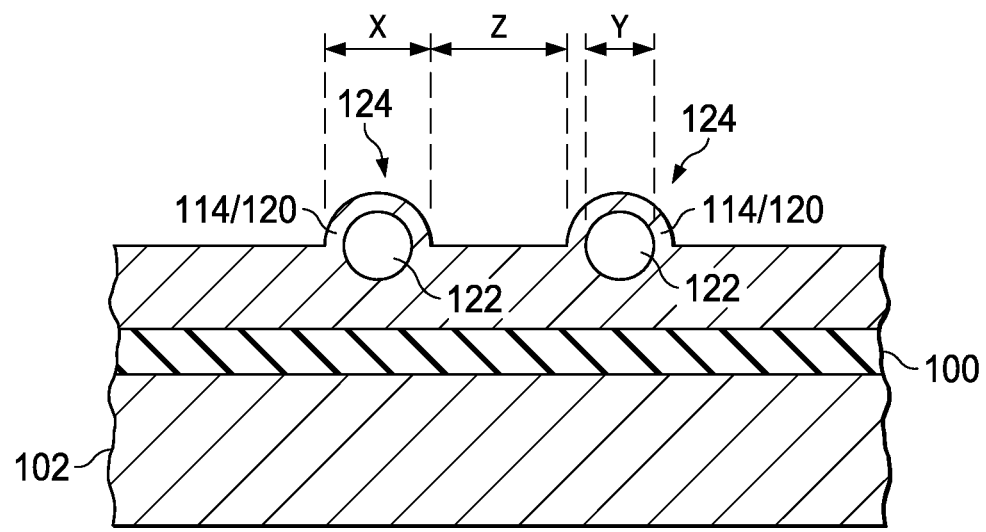

An anneal process as known in the art is then performed in order to effectuate a reflow of the silicon structures surrounding the hollow channels 122. In an embodiment, the anneal may comprise an anneal in a hydrogen (H$_2$) atmosphere at a temperature of 700 degrees Celsius for a duration of about 30 minutes to achieve Si reflow. The result of the anneal process is shown in FIG. 10. The hollow channels 122 reform to have a generally circular cross-section surrounded by the Si structures of silicon layer (Si) 120, second silicon (Si) layer 104 and silicon layer (Si) 114. The diameter of the channels 122 may be selected by choosing the thickness of the epitaxially grown silicon-germanium (SiGe) layer 112. Because accurate control can be exercised over epitaxial growth thicknesses, the process described can produce consistently sized hollow channels 122 for use as nano-scale on-chip optical waveguide structures 124.

In a preferred implementation, as a result of the reflow the hollow channels 122 are produced in a manner wherein a lower portion of the channel 122 is positioned below an upper surface of the reflowed second silicon (Si) layer 104.

In an exemplary implementation, the width x of the structures 124 may be of the range of 100 nm to hundreds of nanometers. In an exemplary implementation, the diameter y of the hollow channels 122 within the structures 124 may be of the range of 50 nanometers to hundreds of nanometers. A spacing z between adjacent structures 124 may be of the range of several tens of nanometers to tens of microns.

Although an SOI type substrate is preferred, it will be understood that a non-SOI type substrate including the second silicon (Si) layer 104 (alone or perhaps as an epitaxial growth over an underlying intrinsic or non-intrinsic semiconductor layer) could be used in place of the PD SOI substrate 10.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. An optical waveguide, comprising:
   a supporting substrate including a layer of insulating material having a top surface; and
   a layer of semiconductor material having a bottom surface in contact with the top surface of the layer of insulating material, said layer of semiconductor material including at least one hollow optical channel contained within the layer of semiconductor material and extending with a length parallel to the top surface of the layer of insulating material, said layer of semiconductor material further having a non-planar top surface including first substantially planar top surface portions on either side of the at least one hollow optical channel and a second curved top surface extending over the at least one hollow optical channel, wherein a lowest portion of an inner surface of the at least one hollow optical channel is positioned below the first substantially planar top surface portions of said layer of semiconductor material.

2. The optical waveguide of claim 1, wherein said at least one hollow optical channel has a cross-section perpendicular to said length that is substantially circular.

3. The optical waveguide of claim 1, wherein the lowest portion of the inner surface of the at least one hollow optical channel is positioned above the top surface of the layer of insulating material.

4. The optical waveguide of claim 1, wherein a highest portion of the inner surface of the at least one hollow optical channel is positioned above the first substantially planar top surface portions of said layer of semiconductor material.

5. The optical waveguide of claim 4, wherein the highest portion of the inner surface of the at least one hollow optical channel is positioned below the second curved top surface of said layer of semiconductor material.

6. The optical waveguide of claim 1, wherein said layer of semiconductor material comprises reflowed silicon.

7. The optical waveguide of claim 1, wherein said at least one hollow optical channel has a circular cross-section with a diameter in a range between 50 nanometers and hundreds of nanometers.

8. The optical waveguide of claim 1, wherein the layer of insulating material is an insulator layer of a silicon on insulator substrate.

9. An optical waveguide, comprising:
a layer of semiconductor material having a bottom surface and a top surface;
a hollow optical channel contained within the layer of semiconductor material and extending with a length parallel to the bottom surface;
wherein said top surface comprises first top surface portions on either side of the hollow optical channel and a second curved top surface portion extending over the hollow optical channel;
wherein a lowest portion of an inner surface of the hollow optical channel is positioned below the first top surface portions; and
wherein a highest portion of an inner surface of the hollow optical channel is positioned above the first top surface portions.

10. The optical waveguide of claim 9, wherein the highest portion of an inner surface of the hollow optical channel is offset from the second curved top surface portion.

11. The optical waveguide of claim 9, wherein said hollow optical channel has a cross-section perpendicular to said length that is substantially circular.

12. The optical waveguide of claim 11, wherein the cross-section has a diameter in a range between 50 nanometers and hundreds of nanometers.

13. The optical waveguide of claim 9, wherein said layer of semiconductor material comprises reflowed silicon.

14. The optical waveguide of claim 9, wherein said layer of semiconductor material is supported by an insulating substrate layer.

15. An optical waveguide, comprising:
a supporting substrate including a layer of insulating material having a top surface; and
a layer of semiconductor material having a bottom surface in contact with the top surface of the layer of insulating material, said layer of semiconductor material including at least one hollow optical channel contained within the layer of semiconductor material and extending with a length parallel to the top surface of the layer of insulating material, said layer of semiconductor material further having a non-planar top surface including first top surface portions on either side of the at least one hollow optical channel and a second top surface extending over the at least one hollow optical channel, wherein a lowest portion of an inner surface of the at least one hollow optical channel is positioned below the first top surface portions of said layer of semiconductor material.

16. The optical waveguide of claim 15, wherein said at least one hollow optical channel has a cross-section perpendicular to said length that is substantially circular.

17. The optical waveguide of claim 15, wherein said layer of semiconductor material comprises reflowed silicon.

18. The optical waveguide of claim 15, wherein said at least one hollow optical channel has a circular cross-section with a diameter in a range between 50 nanometers and hundreds of nanometers.

19. The optical waveguide of claim 15, wherein the layer of insulating material is an insulator layer of a silicon on insulator substrate.

20. The optical waveguide of claim 15, wherein the lowest portion of the inner surface of the at least one hollow optical channel is positioned above the top surface of the layer of insulating material.

21. An optical waveguide, comprising:
a supporting substrate including a layer of insulating material having a top surface; and
a layer of semiconductor material having a bottom surface in contact with the top surface of the layer of insulating material, said layer of semiconductor material including at least one hollow optical channel contained within the layer of semiconductor material and extending with a length parallel to the top surface of the layer of insulating material, said layer of semiconductor material further having a non-planar top surface including first top surface portions on either side of the at least one hollow optical channel and a second top surface extending over the at least one hollow optical channel, wherein a highest portion of the inner surface of the at least one hollow optical channel is positioned above the first top surface portions of said layer of semiconductor material.

22. The optical waveguide of claim 21, wherein said at least one hollow optical channel has a cross-section perpendicular to said length that is substantially circular.

23. The optical waveguide of claim 21, wherein said layer of semiconductor material comprises reflowed silicon.

24. The optical waveguide of claim 21, wherein said at least one hollow optical channel has a circular cross-section with a diameter in a range between 50 nanometers and hundreds of nanometers.

25. The optical waveguide of claim 21, wherein the layer of insulating material is an insulator layer of a silicon on insulator substrate.

26. The optical waveguide of claim 21, wherein the highest portion of the inner surface of the at least one hollow optical channel is positioned below the second top surface of said layer of semiconductor material.

* * * * *